(12) United States Patent
Hatzilias (10) Patent No.: US 11,510,351 B2
(45) Date of Patent: Nov. 22, 2022

(54) SYSTEMS AND METHODS FOR PRECISION PLACEMENT OF COMPONENTS

(71) Applicant: Engent, Inc., Norcross, GA (US)

(72) Inventor: Giorgos Hatzilias, Buford, GA (US)

(73) Assignee: Engent, Inc., Norcross, GA (US)

(*) Notice: Subject to any disclaimer, the term of this patent is extended or adjusted under 35 U.S.C. 154(b) by 306 days.

(21) Appl. No.: 16/733,757

(22) Filed: Jan. 3, 2020

(65) Prior Publication Data
US 2020/0221615 A1 Jul. 9, 2020

Related U.S. Application Data

(60) Provisional application No. 62/788,543, filed on Jan. 4, 2019.

(51) Int. Cl.
| | |
|---|---|
| H05K 7/10 | (2006.01) |
| H05K 7/12 | (2006.01) |
| H05K 13/04 | (2006.01) |
| H05K 3/34 | (2006.01) |

(52) U.S. Cl.
CPC ......... *H05K 13/0469* (2013.01); *H05K 3/341* (2013.01); *H05K 3/3485* (2020.08); *H05K 2203/048* (2013.01); *H05K 2203/166* (2013.01); *H05K 2203/167* (2013.01)

(58) Field of Classification Search
CPC .. H05K 13/0469; H05K 3/3485; H05K 3/341; H05K 2203/048; H05K 2203/166; H05K 2203/167
USPC ........................................................ 361/767
See application file for complete search history.

(56) References Cited

U.S. PATENT DOCUMENTS

| | | | |
|---|---|---|---|
| RE35,263 E | * 6/1996 | Silva | A61C 9/002 |
| | | | 433/34 |
| 2002/0038289 A1 | 3/2002 | Lawlor et al. | |
| 2002/0052185 A1 | 5/2002 | O'Hagan et al. | |
| 2002/0053455 A1 | 5/2002 | Crane et al. | |

(Continued)

FOREIGN PATENT DOCUMENTS

| | | |
|---|---|---|
| CA | 2302793 | 3/2001 |
| CN | 20248764 | 10/2012 |

(Continued)

*Primary Examiner* — Andargie M Aychillhum
(74) *Attorney, Agent, or Firm* — Kristi Halloran; Kirsten Stone (57) ABSTRACT

Precisely aligned assemblies can be complex, time consuming, labor intensive, and expensive and a need exists for better alternatives. Systems and methods described herein yield high precision printed circuit board assemblies (PCBAs) that contain pre-built alignment features to address this need. The work of precisely locating components on the PCBA to a final position in the overall assembly is already built in to the board. Locating features are used to precisely position one or more components, such as optical components, electro optical components, or mechanical components in assemblies. The locating features may be used to constrain the positions of those components, such as by kinematic coupling, solder wetting dynamics, semiconductor cleaving, dicing, photolithographic techniques for etching, constant contact force, and advanced adhesive technology to result in optical level positioning that significantly improves or eliminates assembly alignment challenges.

20 Claims, 5 Drawing Sheets

(56) References Cited

U.S. PATENT DOCUMENTS

| | | |
|---|---|---|
| 2002/0080588 A1 | 6/2002 | Eldridge et al. |
| 2002/0084565 A1 | 7/2002 | Dautartas et al. |
| 2002/0122178 A1 | 9/2002 | mcmurty et al. |
| 2002/0134577 A1 | 9/2002 | Watanabe |
| 2002/0135982 A1 | 9/2002 | Kledzik et al. |
| 2002/0154296 A1 | 10/2002 | Sullivan et al. |
| 2002/0171906 A1 | 11/2002 | Busscher et al. |
| 2002/0180517 A1 | 12/2002 | Bosnyak et al. |
| 2003/0057559 A1* | 3/2003 | Mis .................. H01L 24/10 257/762 |
| 2003/0189769 A1 | 10/2003 | Anderson |
| 2003/0220691 A1 | 11/2003 | Songer et al. |
| 2004/0000584 A1 | 1/2004 | Hellberg et al. |
| 2004/0003941 A1 | 1/2004 | Duxbury et al. |
| 2004/0124004 A1 | 7/2004 | Nair et al. |
| 2004/0129551 A1 | 7/2004 | Kent et al. |
| 2004/0140543 A1 | 7/2004 | Elpedes et al. |
| 2004/0246689 A1 | 12/2004 | Espinoza-Ibarra et al. |
| 2005/0156980 A1 | 7/2005 | Walker |
| 2005/0161771 A1 | 7/2005 | Suehiro et al. |
| 2005/0182585 A1 | 8/2005 | Yang |
| 2005/0189400 A1 | 9/2005 | Ice |
| 2006/0000638 A1 | 1/2006 | Levine et al. |
| 2006/0088254 A1 | 4/2006 | Mohammed |
| 2006/0110109 A1* | 5/2006 | Yi .................. G02B 6/423 385/93 |
| 2006/0142875 A1 | 6/2006 | Keyes et al. |
| 2007/0097648 A1 | 5/2007 | Xu et al. |
| 2007/0123069 A1 | 5/2007 | Choi et al. |
| 2007/0126118 A1 | 6/2007 | Lu et al. |
| 2007/0178616 A1 | 8/2007 | Arai et al. |
| 2007/0228387 A1 | 10/2007 | Negley et al. |
| 2007/0256725 A1 | 11/2007 | Fork et al. |
| 2007/0257272 A1 | 11/2007 | Hutchins |
| 2007/0262339 A1 | 11/2007 | Hussell et al. |
| 2008/0049949 A1 | 2/2008 | Snider et al. |
| 2008/0166927 A1 | 7/2008 | van Haaster |
| 2008/0206516 A1 | 8/2008 | Matsushima |
| 2008/0251893 A1 | 10/2008 | English |
| 2008/0254688 A1 | 10/2008 | Bogursky et al. |
| 2008/0275509 A1 | 11/2008 | Clifford et al. |
| 2009/0040595 A1 | 2/2009 | De Samber et al. |
| 2009/0051004 A1 | 2/2009 | Roth et al. |
| 2009/0052146 A1 | 2/2009 | Busch et al. |
| 2010/0006992 A1 | 1/2010 | Andrianus et al. |
| 2010/0145236 A1 | 6/2010 | Greenberg et al. |
| 2010/0155748 A1 | 6/2010 | Chan |
| 2010/0159716 A1 | 6/2010 | Jaeger |
| 2010/0295822 A1 | 11/2010 | Wang |
| 2010/0301983 A1 | 12/2010 | Furuta et al. |
| 2012/0043119 A1 | 2/2012 | Rathburn |
| 2012/0105057 A1 | 5/2012 | Hendrick |
| 2013/0003298 A1 | 1/2013 | Simon et al. |
| 2013/0037831 A1 | 2/2013 | Rudmann et al. |
| 2013/0162362 A1 | 6/2013 | Harima |
| 2013/0271972 A1 | 10/2013 | Hussell et al. |
| 2014/0048834 A1 | 2/2014 | Sato et al. |
| 2014/0071594 A1* | 3/2014 | Cohen .................. B29C 45/382 361/679.01 |
| 2014/0085850 A1 | 3/2014 | Li et al. |
| 2014/0086533 A1 | 3/2014 | Gold et al. |
| 2014/0211457 A1 | 7/2014 | Tarsa et al. |
| 2016/0105592 A1* | 4/2016 | Dispenza .................. H04N 5/2252 348/373 |
| 2016/0161686 A1 | 6/2016 | Li et al. |

FOREIGN PATENT DOCUMENTS

| | | |
|---|---|---|
| DE | 2516063 | 10/1976 |
| DE | 290753 | 6/1991 |
| DE | 4137191 | 5/1993 |
| DE | 102008019084 | 10/2009 |
| DE | 102010029529 | 12/2011 |
| EP | 2166326 | 3/2010 |
| FR | 2243762 | 4/1974 |
| FR | 2625813 | 7/1989 |
| FR | 2775860 | 9/1999 |
| JP | 1187894 | 7/1989 |
| JP | 1230292 | 9/1989 |
| JP | 2111094 | 4/1990 |
| JP | 3242991 | 10/1991 |
| JP | 4184968 | 7/1992 |
| JP | 5327194 | 12/1993 |
| JP | 6140758 | 5/1994 |
| JP | 6302460 | 10/1994 |
| JP | 6350236 | 12/1994 |
| JP | 9171846 | 6/1997 |
| JP | 11041058 | 2/1999 |
| JP | 2001339146 | 12/2001 |
| JP | 2002280254 | 9/2002 |
| JP | 2002324605 | 11/2002 |
| JP | 2002353578 | 12/2002 |
| JP | 2005340699 | 12/2005 |
| JP | 2006012927 | 1/2006 |
| JP | 2006020243 | 1/2006 |
| JP | 2009278121 | 11/2009 |
| JP | 2017224805 | 12/2017 |
| KR | 2008061816 | 7/2008 |
| KR | 1375524 | 3/2014 |
| SU | 800785 | 1/1981 |
| SU | 876383 | 10/1981 |
| SU | 884799 | 11/1981 |
| SU | 896299 | 1/1982 |

\* cited by examiner

Alignment features in part being aligned to 350
Part being aligned to 340
Locating features 330
Constant contact features 320
LEDs 310
Substrate 305

First Portion 410
Ball 420
V groove 430
Second Portion 450

First Portion 510
Ball 520
Tetrahedral groove 530
V groove 540
Second Portion 550
Circular groove 545

SYSTEMS AND METHODS FOR PRECISION PLACEMENT OF COMPONENTS

This application claims priority to and benefit of U.S. Provisional Patent Application No. 62/788,543, filed on Jan. 4, 2019 and incorporated herewith.

BACKGROUND

Components, including optical components (e.g., reflectors, lenses, optical fibers, etc.), electro optic components (e.g., LEDs (light-emitting diodes), lasers, waveguides, detectors, emitters, VCSELs (vertical-cavity surface-emitting lasers), etc.), or other precision components are often mounted in a mechanical stackup approach in order to form a precisely aligned assembly. Alternatively, a great deal of effort is spent actively aligning each and every assembly. Often times in the stackup approach, each component must each be individually manufactured to high precision tolerances in order to achieve the desired final alignment in the overall assembly, thus increasing complexity, time, and cost of the entire assembly. For example, high volume thixomolded automotive headlamp brackets may require secondary machining operations to add precise alignment features requiring additional fixturing, setup, and labor, and thus increasing the total assembly cost. In another example, the lenses in mobile phones must be actively aligned for each individual camera module with significant effort and expense.

There is a need for less complex, less time consuming, and less expensive assemblies and techniques to align components in assemblies with greater precision and increased assembly efficiency (e.g., camera modules, automotive LED headlamps, fiber optic assemblies, electro-optic assemblies, fine pitch electronic assemblies, etc.).

SUMMARY

Locating features such as electronic surface mount components, MEMS components (semiconductor based microelectromechanical systems), or NEMS components (nanoelectromechanical systems) may be used as physical locating features to constrain the positions of components within an assembly. The placement of the components may be further constrained using wetting dynamics to precisely locate said locating features. The overall alignment may be further refined by leveraging advanced kinematic coupling techniques.

In an implementation, an assembly comprises a substrate or a bare die microchip, at least one pad disposed on the substrate or die, at least one locating feature disposed on the pad using an attachment means, and at least one component disposed in a position in the assembly. With respect to the attachment means, any type of attachment materials may be used such as hot melt adhesive, reactive hot melt adhesive, or any type of solder. The at least one locating feature constrains the position in the assembly of the at least one component being aligned.

In an implementation, a method of fabricating an assembly comprises disposing an attachment means comprising an attachment material on at least one pad on a substrate or die, disposing at least one locating feature on a respective one of the at least one pad, and disposing at least one component to be positioned. The at least one locating feature is configured to act as a mechanical locating feature for aligning components. The position of the at least one aligned component is constrained by the at least one locating feature.

In one embodiment, the method further includes removing the at least one locating feature from the assembly after disposing the at least one component. In one embodiment, the assembly is a headlamp, automotive lighting, a printed circuit assembly, a camera, a lens, an electronic device for the visual presentation of data, a mixed reality headset, a virtual reality headset, a 3D scanner, a measurement device, a microscope, or a precision instrument. In another embodiment, the method further includes precisely locating in 3D space the at least one component to an additional component, wherein the additional component comprises an electro optical component, an optical component, or a mechanical component. In a different embodiment, the method further includes disposing an electronic circuit on the substrate, wherein the electronic circuit comprises at least one of an electro optical component, an optical component, or a mechanical component.

In one embodiment, the at least one component includes a reflector or a lens, and the electro optical component, the optical component, or the mechanical component includes an LED. In another embodiment, the method further includes kinematically coupling the least one component within the assembly. In one embodiment, kinematically coupling the least one component includes kinematically coupling the at least one component to the at least one locating feature.

In one embodiment, the attachment material comprises an adhesive, or even a hot melt adhesive or a reactive hot melt adhesive. In a different embodiment, the attachment material comprises solder. In another embodiment, the method further includes aligning the at least one locating feature using an attachment means, wherein the attachment means includes the attachment material. In another embodiment, the at least one locating feature comprises a plurality of locating features, and wherein the at least one component comprises a plurality of components. In a different embodiment, the method includes depositing an adhesive that retains the position of the plurality of components after they are disposed in the position in the assembly.

In one embodiment, the method includes disposing the at least one component in the position on the substrate including disposing the at least one component on one of a mounting bracket or a heat sink. In another embodiment, the method further includes providing structural support to the assembly without the at least one locating feature providing any structural support to the assembly.

In an implementation, a method of aligning components comprises aligning a plurality of locating features with respect to respective pads by disposing the plurality of locating features on wet attachment material on the respective pads, and aligning a plurality of components by constraining the positions of the plurality of components using the plurality of locating features. An attachment means aligns the plurality of locating features with respect to the respective pads. Any type of attachment material(s) may be used, such as hot melt adhesive, reactive hot melt adhesive, or any type of solder.

In one embodiment, the method further includes positioning the pads on a circuit board. In another embodiment, the method further includes positioning the pads on a substrate, wherein the substrate is a mounting bracket or a heat sink. In a different embodiment, the method further includes providing structural support to the mounting bracket or the heat sink without any structural support from the plurality of locating features.

In one embodiment, the method further includes installing the substrate in a headlamp, automotive lighting, a printed circuit assembly, a camera, a lens, an electronic device for the visual presentation of data, a mixed reality headset, a virtual reality headset, a 3D scanner, a measurement device, a microscope, or a precision instrument. In another embodiment, the plurality of components comprises a reflector or a lens.

In one embodiment, the method further includes precisely locating in 3D space each of the plurality of components to at least one electro optical component, at least one optical component, or at least one mechanical component. In one embodiment, the method further includes kinematically coupling each of the plurality of components to the plurality of locating features. In another embodiment, the method further includes removing the plurality of locating features from the respective pads after aligning the plurality of locating features. In a different embodiment, the method further includes depositing an adhesive that retains the position of the plurality of components after aligning the plurality of components.

In an implementation, a kinematic coupling comprises a substrate or die, at least one locating feature, and at least one pad on the substrate, on which the at least one locating feature is disposed.

In one embodiment, the kinematic coupling further includes at least one component.

In one embodiment, the substrate is a printed circuit substrate, and the at least one locating feature is disposed on the printed circuit substrate using an attachment means. In another embodiment, the attachment means of the kinematic coupling includes an adhesive. In another embodiment, the attachment means comprises a hot melt adhesive or a reactive hot melt adhesive. In another embodiment, the attachment means comprises solder.

In one embodiment, the kinematic coupling further includes dimensionally stable adhesives for retaining the position of the electronic circuit. In another embodiment, the kinematic coupling further includes at least one electro optical component, at least one optical component, or at least one mechanical component. In a different embodiment, the kinematic coupling further includes an LED.

In one embodiment, the kinematic coupling further includes mating alignment features on mating parts. In another embodiment, the at least one locating feature comprises at least one surface mounted component. In a different embodiment, a headlamp comprising the kinematic coupling.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

The claimed subject matter is described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

Figure 1:
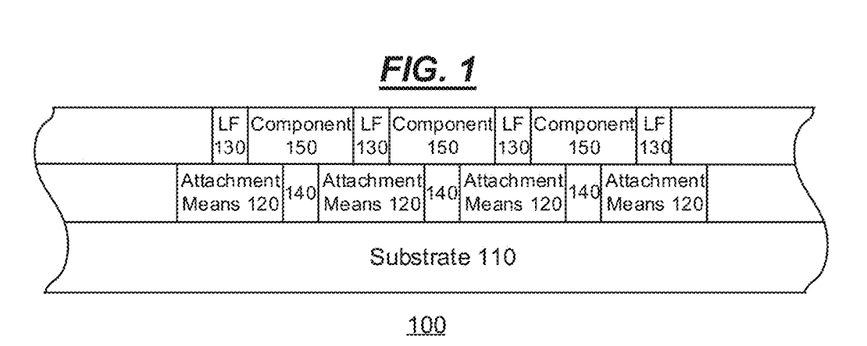
FIG. 1 is an illustration of a side view of an implementation of an assembly comprising components.

FIG. 1 is an illustration of a side view of an implementation of an assembly 100 comprising components 150. The assembly 100 comprises a substrate 110, such as a printed circuit substrate or printed circuit board (PCB). The assembly 100 may be a printed circuit assembly.

One or more attachment means 120, comprising one or more attachment materials, are disposed on the substrate 110. Any type of attachment materials may be used, such as hot melt adhesive, reactive hot melt adhesive, or any type of solder. For implementations using solder as the attachment material in the attachment means 120, any type of solder pads may be used, such as tin-lead, silver, or gold-plated copper pads, depending on the implementation. For implementations using solder as the attachment material in the attachment means 120, solder paste is disposed on solder pads (e.g., using screen printing or any other conventional technique). Many types of solder paste may be used, depending on the implementation. In some implementations, a pad may be a redistribution layer, or may be disposed on a bare die microchip in stacked die or wafer level assembly type applications. Although solder pads and solder are used in some of the implementations described herein, this is not intended to be limiting as any attachment means and/or materials may be used in addition to, or in place of, solder including, but not limited to, hot melt adhesive and reactive hot melt adhesive.

Locating features (LF) 130 are disposed on the attachment means 120. In some implementation, the locating features 130 may comprise surface mounted components and may be disposed using specialized surface mount technology and/or surface mount equipment, such as a pick-and-place machines. The surface mounted components 130 are self-aligned because of careful control of the properties of the attachment material, e.g., as it reflows in some implementations (such as in a reflow soldering over) for bonding the surface mounted components 130 to the attachment material 120 on the substrate 110. In some implementations, the locating features 130 comprise materials and/or parts other than, or in addition to, surface mounted components.

The locating features 130 are used for subsequent positioning of the components 150 to be aligned in the assembly 100. Example components 150 include optical reflectors and lenses, for example, though any optical component or mechanical component may be used. The locating features 130 are configured to act as mechanical locating features for the components 150, and do not necessarily provide any structural support in the assembly 100. Each locating feature 130 constrains the position of the associated component 150 in the assembly 100. It is contemplated that at least one surface of the locating feature 130 is used to constrain the position of the component 150 in the assembly 100.

Additional components 140 may be disposed on the substrate using surface mount techniques or by any other known techniques. Each additional component 140 may comprise an image sensor e.g., complementary metal-oxide-semiconductor (CMOS) sensor, an LED (light-emitting diode), a laser (e.g., a vertical-cavity surface-emitting laser or VCSEL), a waveguide, etc. or any other optical or electronic component. Additionally or alternatively, electro optical components and/or mechanical components may be used in place of, or in addition to, the components 140 shown in FIG. 1.

In an implementation, the components 150 are precisely located in three-dimensional (3D) space relative to the additional components 140, using the locating features 130. In this manner, for example, a reflector may be precisely located relative to an LED in all six degrees of freedom in a headlamp. Moreover, in an implementation, the surface tension of the solder (or other attachment material in the attachment means 120) if processed properly, can be used to self-align the mechanical locating components to very high precision relative to the reflector (or other component 150).

In an implementation, each of the components 150 is kinematically coupled within the assembly 100, e.g., to the locating features 130. Kinematic coupling describes positioning features and methods designed to exactly constrain the part in question, providing precision and certainty of location in all six degrees of freedom. It is noted that in some implementations, an LED may use electrical solder joints. In this manner, an LED may be precisely placed in an assembly by mounting the LED on a PCBA that also contains kinematic coupling locating features (described further herein).

Depending on the implementation, the assembly 100 may be, or be comprised within, automotive lighting, a camera, a lens, an electronic device for the visual presentation of data, a mixed reality headset, a virtual reality headset, a 3D scanner, a measurement device, a microscope, or a precision instrument. Alternatively or additionally, the assembly 100 may comprise a heatsink, a mounting bracket, and the components 150 may be disposed on the heatsink or the mounting bracket.

In an implementation, an adhesive may be used to retain the positions of the components 150, the additional components 140, and/or the locating features 130 after they have been positioned in the assembly 100. Thus, an adhesive can be used to retain the position of components once they are placed. The adhesive preferably has a rapid curing cycle. The adhesive further can flow easily prior to cure to enable bulk filling. The adhesive can alternatively cure with heat or with both ultraviolet (UV) light and heat. The adhesive can be a one component adhesive or a two component adhesive. The adhesive can be selected from the group consisting of epoxy based adhesive and acrylic based adhesive. The acrylic based adhesive can be a silane modified acrylic or a polyurethane modified acrylic. In an embodiment, the adhesive is a room temperature applied adhesive that cures when exposed to ultraviolet (UV) light. Any type of adhesive(s) may be used, depending on the implementation.

Figure 2:
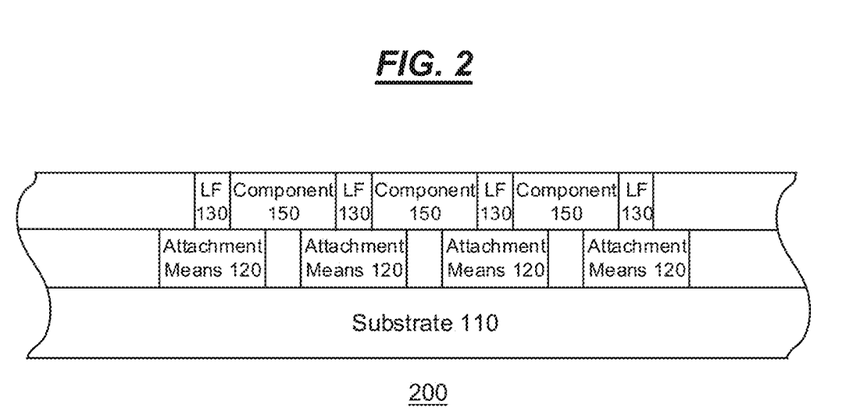
FIG. 2 is an illustration of a side view of another implementation of an assembly comprising components.

FIG. 2 is an illustration of a side view of another implementation of an assembly 200 comprising components 150. The assembly 200 is similar to the assembly 100 described with respect to FIG. 1, but does not comprise the additional components 140.

The techniques presented herein may be utilized to produce many types of systems, apparatus, and devices with integrated electrical components. Such systems, apparatus, and devices include a headlamp, automotive lighting, a printed circuit assembly, a camera, a lens, an electronic device for visual presentation of data, a mixed reality headset, a virtual reality headset, a 3D scanner, a measurement device, a microscope, or a precision instrument. No aspect of FIG. 1 is intended to be limiting in any sense, for numerous variants are contemplated as well.

In a mechanical system, there are six potential degrees of freedom. There are three linear degrees of freedom, the "x", "y", and "z" axis, and three rotational degrees of freedom around each axis, referred to as pitch, roll, and yaw. Kinematic coupling theory attempts to minimize the points of contact to only make contact ideally with the number of points equal to the number of degrees of freedom that are to be restrained. This is to optimize kinematic repeatability. Well known variations of kinematic couplings include the Kelvin coupling and the Maxwell coupling. These and other coupling variations may be used to precisely mate or join components herein to a substrate or other mating portion and/or relative to components such as the electro optical components, the optical components, and/or mechanical components described herein.

In some embodiments, manufacturing processes from the semiconductor industry can be leveraged to achieve improved precision. For example, since semiconductor wafers are fabricated to high purity of singular crystalline structures with low levels of crystal lattice defects, it is possible to cleave or mechanically propagate a physical separation along a crystalline axis, thus achieving dimensional precision approaching atomic levels of precision.

Figure 3:
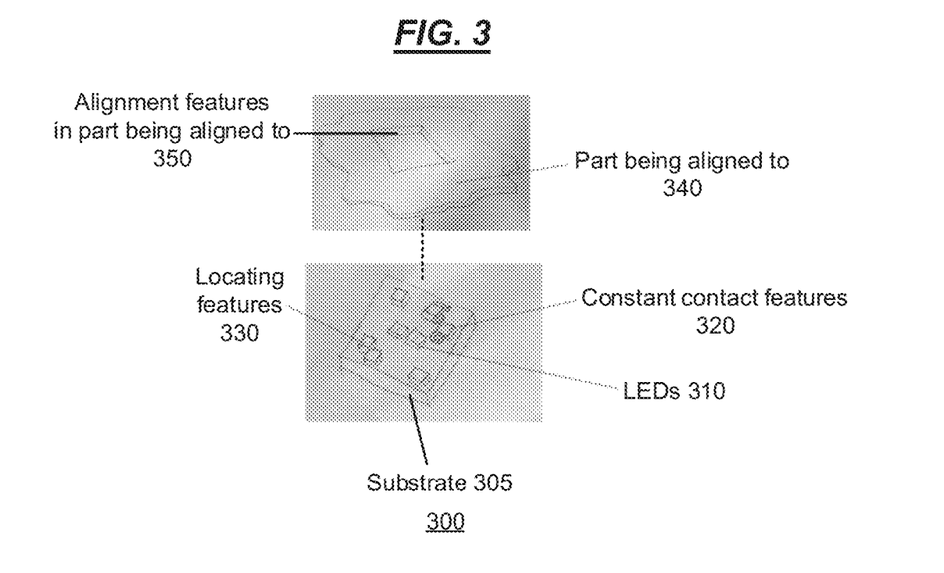
FIG. 3 is an illustration of a perspective view of another implementation of an assembly.

FIG. 3 is an illustration of a perspective view of another implementation of an assembly 300. The assembly 300 comprises a substrate 305, such as a printed circuit substrate or PCB. The assembly 300 may be a printed circuit assembly.

In an implementation, disposed on the substrate 305 are LEDs 310, constant contact features 320, such as those that may be used with kinematic coupling, and locating features 330. Moreover, the LEDs 310, constant contact features 320, and locating features 330 may be affixed to the substrate 305 using appropriate solder pads or other attachment means, not shown, on the substrate 305.

The locating features 330 may comprise surface mounted components, such as the surface mounted components 130, and act as mechanical locating features (e.g., for the LEDs 310). Although LEDs 310 are shown, any type of components, such as an optical component, electro optical component, or mechanical components may be used, such as the components 150 or the additional components 140.

Also shown in FIG. 3 is the part 340 that the substrate 305 is being aligned to. The part 340 being aligned to may comprise alignment features 350 (of any appropriate form and/or shape) that may be used in the alignment of the substrate 305 with the part 340.

Figure 4:
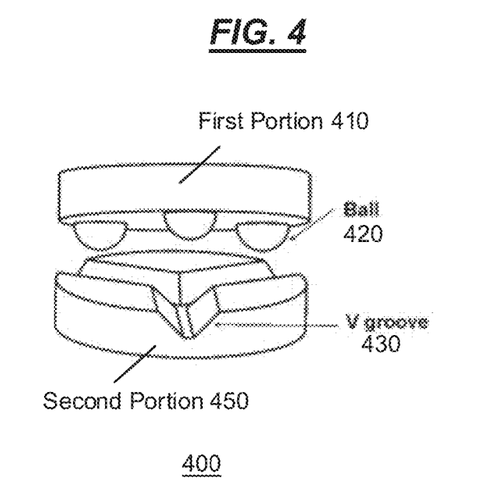
FIG. 4 is a diagram of an example kinematic coupler.

FIG. 4 is a diagram of an example kinematic coupler 400. A first portion 410 has three balls 420 (i.e., hemispheres) disposed on one surface that mate with three radial v grooves 430 on the surface of a second portion 450. Each ball 420 has two contact points for a total of six contact points, to constrain all six degrees of freedom of the coupler 400.

Figure 5:
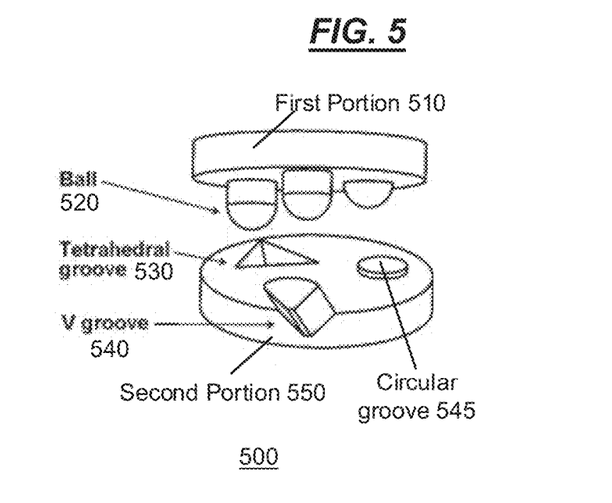
FIG. 5 is a diagram of another example kinematic coupler.

FIG. 5 is a diagram of another example kinematic coupler 500. The first portion 510 has three balls 520 (i.e., hemispheres) disposed on one surface that fit into a tetrahedral groove 530, a v groove 540, and a circular groove 545, respectively, on the surface of a second portion 550.

The balls 420, the radial v grooves 430, the tetrahedral groove 530, the v groove 540, and the circular groove 545 are mating alignment features. Similar mating alignment features may be disposed or otherwise fabricated on parts or portions of the assembly (e.g., the assembly 100, the assembly 200, the assembly 300) that are to be mated or joined together using kinematic coupling. Such mating alignment features may comprise the surface mounted components in some implementations and may not include the surface mounted components in other implementations.

Figure 6:
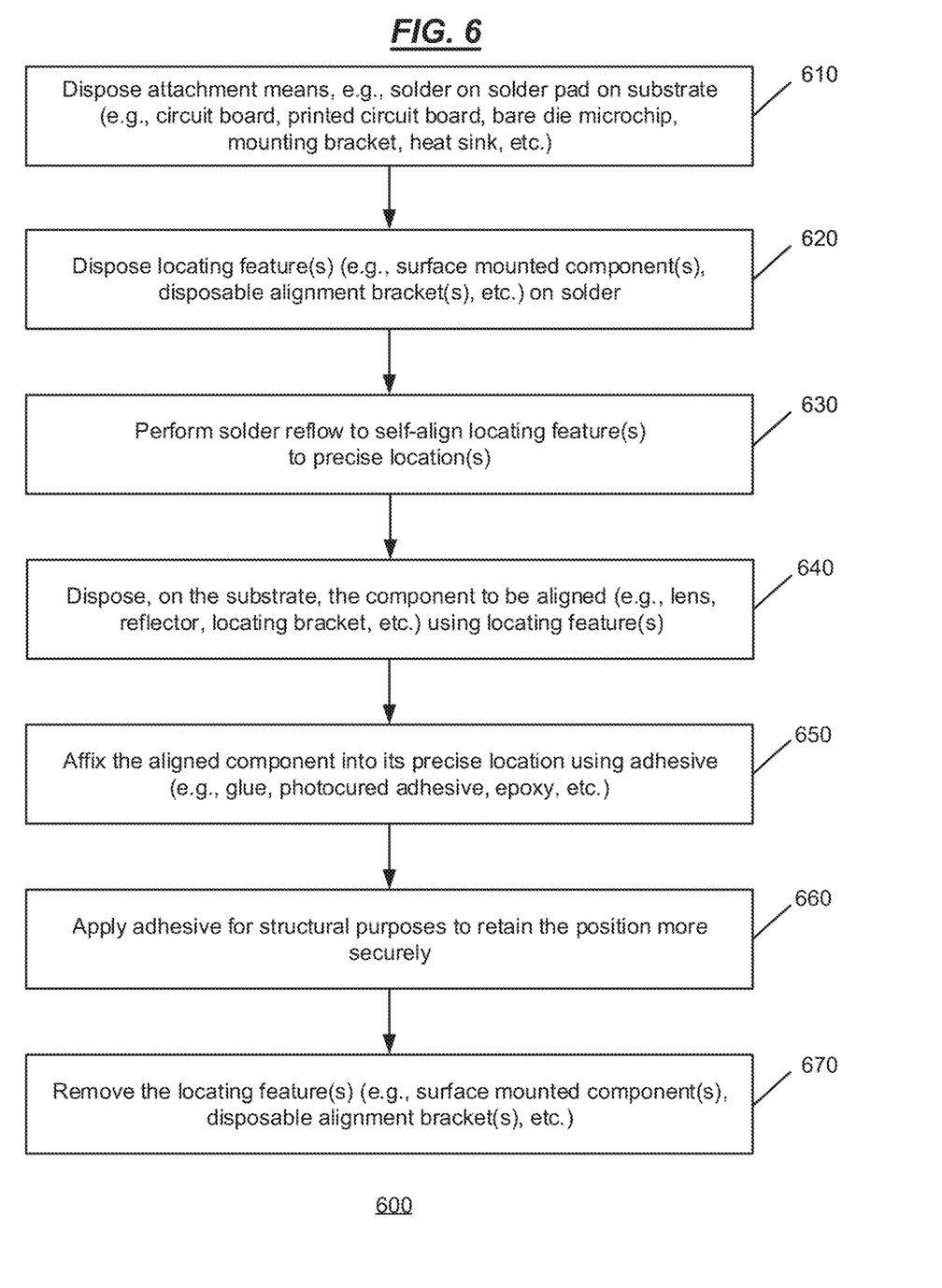
FIG. 6 is an operational flow of an implementation of a method of fabricating an assembly.

FIG. 6 is an operational flow of an implementation of a method 600 of fabricating an assembly. At 610, solder (e.g., in the form of solder paste) or another attachment means and/or attachment material(s) is disposed (e.g., on a solder pad) on a substrate. In an implementation, the substrate may be a circuit board, such as a printed circuit board. The substrate may also take the form of a bare die microchip, a mounting bracket, or heat sink, for example, depending on the implementation. Other types of substrates may be used.

At 620, a locating feature, such as a locating feature 130, is disposed or otherwise fabricated on the solder pad (e.g., on the solder paste on the solder pad). The locating feature may be fabricated on the solder pad using known screen printing techniques or any other surface mount technology. It is contemplated that multiple locating features may be disposed on respective solder pads at approximately the same time. The locating feature(s) may comprise one or more surface mounted components, disposable alignment brackets, etc., depending on the implementation.

At 630, self-aligning is performed. In some implementations, solder reflow is performed to self-align locating feature(s) 130 to precise location(s). For example, solder reflow (e.g., using a reflow soldering oven) is performed to bond the locating feature 130 (and, in some implementations, the additional component 140 to the solder pad. The surface tension of the molten solder automatically aligns the locating feature on its pad.

At 640, the component 150 to be aligned (e.g., a lens, a reflector, a locating bracket, etc.) using the locating features is disposed on the substrate 110 (e.g., on solder paste on a solder pad on the substrate) using any known technology. Thus, for example, in an implementation, a component 150, such as a reflector or a lens, is disposed on the substrate 110 using the locating feature 130 as a mechanical locating feature. Because the locating feature 130 was precisely aligned during the solder reflow operation, the component 150 is precisely positioned based on, and relative to, the locating feature 130. It is contemplated that multiple components 150 may be disposed on the substrate 110, at desired positions, at approximately the same time. In an implementation, one or more surfaces of the locating feature 130 constrains the position of the component 150. The component 150 may be precisely located in 3D space relative to the additional component 140, using the locating feature 130 as the locating feature.

At 650, the aligned component 150 is affixed into its precise location. In some implementations, a glue is used to affix the aligned component 150 into its precise location. In some implementations, a photocured adhesive may be used to lock the precise position in place (e.g., a fast curing but brittle UV (ultraviolet) cured epoxy is used to retain the precise position). Thus, for example, an adhesive may be disposed appropriately on the assembly 100 to retain the position of the component 150 as well as other components in the assembly 100.

At 660, a second adhesive may be applied for structural purposes to retain the position more securely. In some implementation, a structural epoxy may be used to increase the bond area and bond strength to retain the position during exposure to vibration, temperature, or physical forces, or for other ruggedization or environmental exposure purposes.

At 670, in some implementations, the locating feature 130 may be removed to eliminate risk of foreign object debris (FOD). In this manner, the locating feature 130 which was used for alignment only, is removed. Thus, for example, the locating feature 130 is removed from the assembly 100 (e.g., from the solder pad) using any known removal technique. Because the locating feature 130 is used as a locating feature and not for any structural support, functional, operational, or electrical purpose, it may be removed without affecting the assembly 100.

Figure 7:
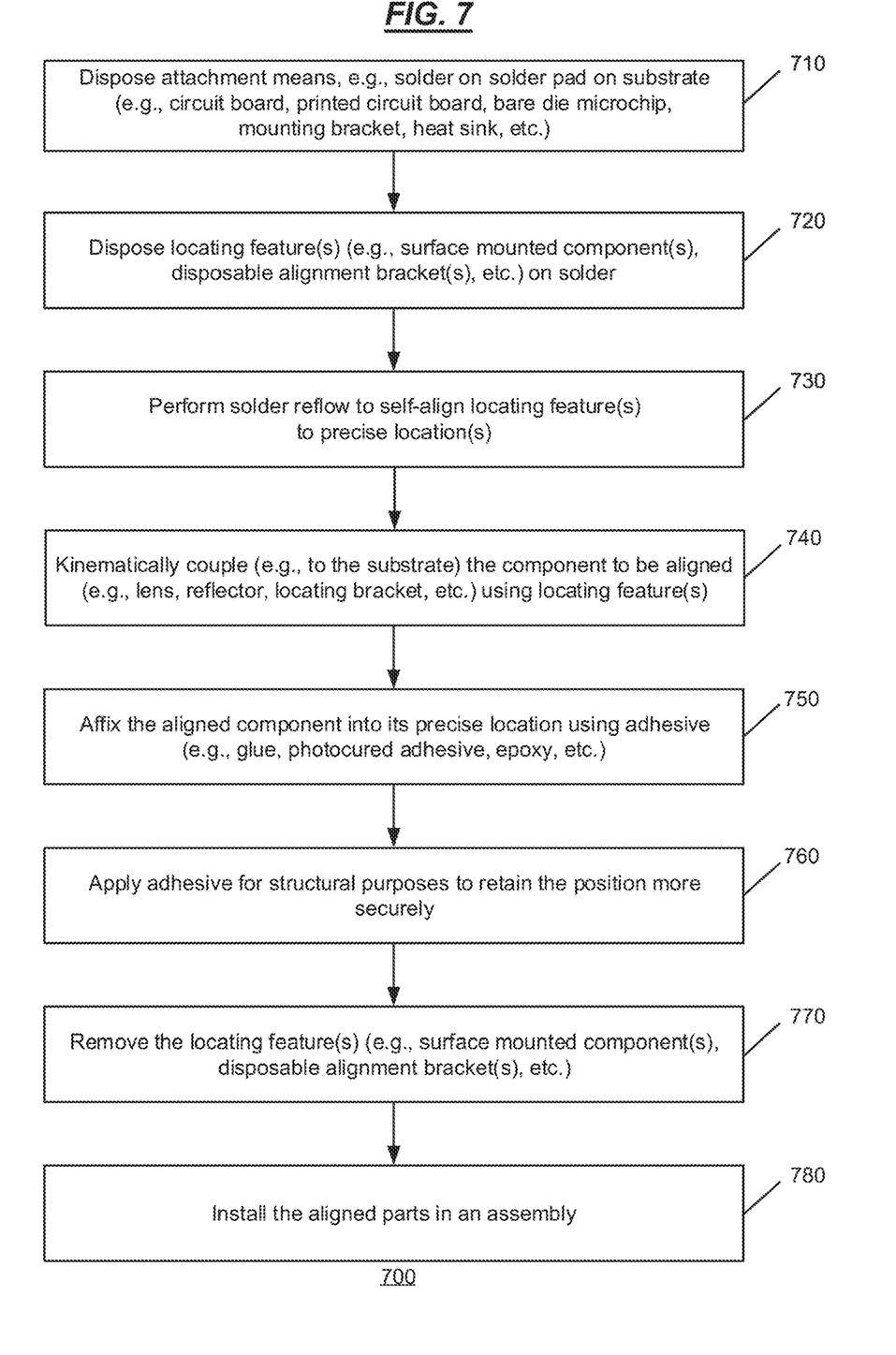
FIG. 7 is an operational flow of another implementation of a method of fabricating an assembly.

FIG. 7 is an operational flow of another implementation of a method 700 of fabricating an assembly. Operations 710, 720, and 730, are similar to operations 610, 620, and 630, respectively, and their descriptions are omitted for brevity.

At 740, the component 150 to be aligned (e.g., a lens, a reflector, a locating bracket, etc.) using surface mounted locating features (i.e., surface mounted components, such as the locating features 130) is kinematically coupled. In an implementation, the component 150 is kinematically coupled to the substrate using the locating feature 130 as a mechanical locating feature. The locating feature 130 constrains the position of the component 150.

Operations 750, 760, and 770, are similar to operations 650, 660, and 670, respectively, and their descriptions are omitted for brevity.

At 780, the aligned parts are installed in the precision assembly, leveraging the locating features and kinematic coupling for positioning in precise assemblies such as a headlamp, automotive lighting, a printed circuit assembly, a camera, a lens, electronic devices, virtual or augmented reality devices, 3D scanners, electrooptic assemblies, fiber optic assemblies, measurement devices, microscopes, or other precision instruments, for example.

Figure 8:
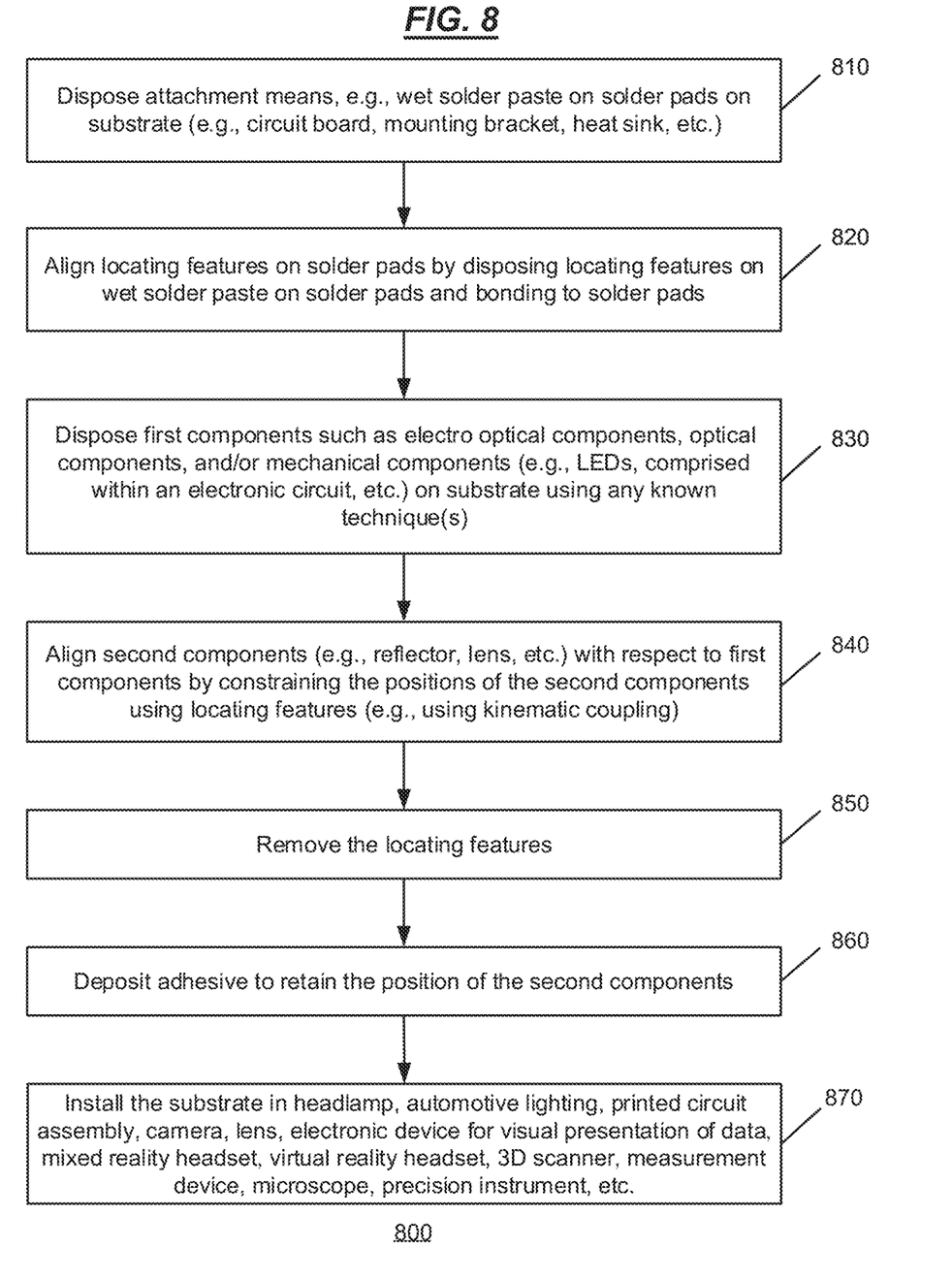
FIG. 8 is an operational flow of an implementation of a method of aligning components.

FIG. 8 is an operational flow of an implementation of a method 800 of aligning components. At 810, wet solder paste is disposed or otherwise applied to solder pads on a substrate. At 820, locating features, which are subsequently used as mechanical locating features, are disposed on the wet solder paste and self-align due to the surface tension of the wet solder paste. The solder paste then hardens, resulting in the locating features being precisely positioned on the solder pads.

At 830, components, such as electro optical components, optical components, and/or mechanical components (e.g., the additional components 140) are disposed on the substrate at desired positions using any known technique(s).

At 840, components (such as the components 150) are placed in the assembly and aligned with respect to the additional components 140 by constraining the positions of the components using the locating features 130 as precise locating features. In an implementation, the components 150 may be placed in the assembly and aligned at approximately the same time.

In an implementation, the components 150 may be kinematically coupled to the locating features 130 and/or the additional components 140 in the assembly. One or more surfaces of the locating features 130 may be used to constrain the position of the components 150 in a kinematic coupling. Thus, the locating features may be used as one or more mating alignment features on parts or portions that are joined together through kinematic coupling. Such parts or portions include the components and the substrate, in an implementation.

Depending on the implementation, the locating features may be removed from the substrate (e.g., from the solder pads) at 850 after the components 150 have been aligned with additional components 140, e.g., as the locating features do not provide any structural support, functional, operational, or electrical purpose to the assembly at this point.

At 860, an adhesive may be disposed appropriately on the assembly to further retain the position of the components 150 as well as the additional components 140 (if any) in the assembly.

At 870, the substrate with the components disposed thereon (as the assembly) may be installed in a headlamp, automotive lighting, a printed circuit assembly, a camera, a lens, an electronic device for visual presentation of data, a mixed reality headset, a virtual reality headset, a 3D scanner, a measurement device, a microscope, or a precision instrument, for example. These examples of systems, apparatus, and devices in which the assembly may be installed in or comprised within are only examples, and are not intended to be limiting. The assembly may be used as an electronic circuit with its components used to perform an electrical function.

In an implementation, an assembly comprises a substrate or a bare die microchip, at least one pad disposed on the substrate or the bare die microchip, at least one locating feature disposed on the pad using an attachment means, and at least one component disposed in a position in the assembly. The at least one locating feature constrains the position in the assembly of the at least one component.

Implementations may include some or all of the following features. The substrate comprises a printed circuit substrate. At least one surface of the at least one locating feature constrains the position of the at least one component. The at least one locating feature is configured to act as a mechanical locating feature for the component. The assembly further comprises at least one of an additional component such as an electro optical component, an optical component, or a mechanical component disposed on the substrate. The electro optical component, optical component, or mechanical component comprises a printed circuit board assembly (PCBA) containing a light source or a light-emitting diode (LED), for example. The at least one component or a subassembly containing the at least one component is kinematically coupled within the assembly. The at least one component is kinematically coupled to the at least one locating feature. The solder self-aligns the at least one locating feature. The at least one component is surface mounted. The at least one component is a reflector or a lens. The assembly is one of automotive lighting, a camera, a lens, an electronic device for the visual presentation of data, a mixed reality headset, a virtual reality headset, a 3D scanner, a measurement device, a microscope, or a precision instrument. The at least one locating feature comprises a plurality of surface mounted mechanical locating features, and wherein the at least one component comprises a plurality of components. The assembly further comprises an adhesive that retains the position of the plurality of components after they are disposed in the position in the assembly. The assembly further comprises a mounting bracket, wherein the at least one component is disposed in the position on the mounting bracket. The assembly further comprises a heat sink, wherein the at least one component is disposed in the position on the heat sink. The at least one locating feature does not provide any structural support in the assembly.

In an implementation, a method of fabricating an assembly comprises disposing attachment material(s) on at least one pad on a substrate, disposing at least one locating feature on a respective one of the at least one pads, and disposing at least one component in a position on the substrate. The at least one locating feature is configured to act as a mechanical locating feature for components. The position of the at least one component is constrained by the at least one locating feature.

Implementations may include some or all of the following features. Disposing the at least one component comprises precisely placing the at least one component using the surfaces of the least one locating feature to constrain the position of the at least one component. The method further comprises removing the at least one locating feature from the assembly after disposing the at least one component. The assembly is a headlamp, automotive lighting, a printed circuit assembly, a camera, a lens, an electronic device for the visual presentation of data, a mixed reality headset, a virtual reality headset, a 3D scanner, a measurement device, a microscope, or a precision instrument. The method further comprises precisely locating in 3D space the at least one component to an additional component, such as an electro optical component, an optical component, or a mechanical component. The method further comprises disposing an electronic circuit on the substrate, wherein the electronic circuit comprises at least one of an electro optical component, an optical component, or a mechanical component. The at least one component comprises a reflector or a lens, and wherein the electro optical component, optical component, or mechanical component comprises an LED. The method further comprises kinematically coupling the least one component within the assembly. Kinematically coupling the least one component comprises kinematically coupling the at least one component to the at least one locating feature. The method further comprises aligning the at least one locating feature using an attachment means. The at least one locating feature comprises a plurality of locating features, and wherein the at least one component comprises a plurality of components. The method further comprises depositing an adhesive that retains the position of the plurality of components after they are disposed in the position in the assembly. Disposing the at least one component in the position on the substrate comprises disposing the at least one component on one of a mounting bracket or a heat sink. The method further comprises providing structural support to the assembly without the at least one locating feature providing any structural support to the assembly.

In an implementation, a method of aligning components comprises aligning a plurality of locating features with respect to respective pads by disposing the plurality of locating features on the respective solder pads, and aligning a plurality of components with respect to respective electro optical components, respective optical components, and/or respective mechanical components by constraining the positions of the plurality of components using the plurality of locating features. A wet attachment material aligns the plurality of locating features with respect to the respective pads.

Implementations may include some or all of the following features. The method further comprises positioning the pads on a circuit board. The method further comprises positioning the pads on a substrate, wherein the substrate is a mounting bracket or a heat sink. The method further comprises providing structural support to the mounting bracket or the heat sink without any structural support from the plurality of locating features. The method further comprises installing the substrate in a headlamp, automotive lighting, a printed circuit assembly, a camera, a lens, an electronic device for the visual presentation of data, a mixed reality headset, a virtual reality headset, a 3D scanner, a measurement device, a microscope, or a precision instrument. Each of the plurality of components comprises a reflector or a lens. The method further comprises precisely locating in 3D space each of the plurality of components to at least one additional component such as at least one electro optical component, at least one optical component, or at least one mechanical component. The method further comprises kinematically coupling each of the plurality of components to the plurality of locating features. The method further comprises removing the locating features from the respective pads after aligning the plurality of locating features. The method further comprises depositing an adhesive that retains the position of the plurality of components after aligning the plurality of components.

In an implementation, a kinematic coupling comprises a substrate, at least one locating feature, and at least one pad on the substrate, on which the at least one locating feature is disposed.

Implementations may include some or all of the following features. The kinematic coupling comprises at least one component to be aligned. The substrate is a printed circuit substrate, and the at least one locating feature is disposed on the printed circuit substrate using an attachment means comprising an attachment material. The attachment material could be any type of adhesive such a hot melt adhesive, a reactive hot melt adhesive, or any type of solder. The kinematic coupling comprises dimensionally stable adhesives for retaining the position of the electronic circuit. The kinematic coupling comprises at least one electro optical component, at least one optical component, or at least one mechanical component. The kinematic coupling comprises an LED. The kinematic coupling comprises mating alignment features on mating parts. The kinematic coupling is comprised within a headlamp.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. An assembly comprising: a bare die microchip comprising a semi-conductor wafer level assembly; at least one pad disposed on the bare die microchip; at least one mechanical locating feature disposed on the pad using self aligning attachment means; and at least one component disposed in a position in the assembly, wherein the at least one mechanical locating feature constrains the position in the assembly of the at least one component.

2. The assembly of claim 1, further comprising a substrate.

3. The assembly of claim 2, further comprising an additional component disposed on the substrate, wherein the additional component comprises at least one of an electro optical component, an optical component, or a mechanical component.

4. The assembly of claim 3, wherein the electro optical component, the optical component, or the mechanical component comprises a printed circuit board assembly (PCBA) containing a light source or a light-emitting diode (LED).

5. The assembly of claim 1, wherein the at least one component or a subassembly containing the at least one component is kinematically coupled within the assembly.

6. The assembly of claim 5, wherein the at least one component is kinematically coupled to the at least one locating feature.

7. The assembly of claim 1, wherein the at least one component is surface mounted.

8. The assembly of claim 1, wherein the at least one component is a reflector or a lens.

9. The assembly of claim 1, wherein the assembly is one of automotive lighting, a camera, a lens, an electronic device for the visual presentation of data, a mixed reality headset, a virtual reality headset, a 3D scanner, a measurement device, a microscope, or a precision instrument.

10. The assembly of claim 1, wherein the at least one mechanical locating feature comprises a plurality of mechanical locating features, and wherein the at least one component comprises a plurality of components.

11. The assembly of claim 10, further comprising an adhesive that retains the position of the plurality of components after they are disposed in the position in the assembly.

12. The assembly of claim 1, further comprising a mounting bracket, wherein the at least one component is disposed in the position on the mounting bracket.

13. The assembly of claim 1, further comprising a heat sink, wherein the at least one component is disposed in the position on the heat sink.

14. The assembly of claim 1, wherein the at least one locating feature does not provide any structural support in the assembly.

15. The assembly of claim 1, wherein the at least one pad is etched by photolithographic techniques.

16. The assembly of claim 1, wherein the self aligning attachment means is a material selected from the group consisting of hot melt adhesive, reactive hot melt adhesive and solder.

17. The assembly of claim 1, wherein the component is selected from the group consisting of optical component, electro optical component and mechanical component.

18. A method of fabricating an assembly, the method comprising:
    disposing an attachment material on at least one pad on a bare die microchip;
    disposing at least one locating feature on a respective one of the at least one pads using the attachment material, wherein the at least one locating feature is configured to act as a mechanical locating feature for components; and
    disposing at least one component in a position on a substrate, comprising constraining the position of the at least one component by the at least one locating feature.

19. The method of claim 18, wherein disposing the at least one component comprises precisely placing the at least one component using the surfaces of the least one locating feature to constrain the position of the at least one component.

20. The method of claim 18, further comprising removing the at least one locating feature from the assembly after disposing the at least one component.

* * * * *